United States Patent [19]

Kinoshita

[11] Patent Number: 4,764,674

[45] Date of Patent: Aug. 16, 1988

[54] HIGH TIME RESOLUTION ELECTRON MICROSCOPE

[75] Inventor: Katsuyuki Kinoshita, Shizuoka, Japan

[73] Assignee: Hamamatsu Photonics Kabushiki Kaisha, Shizuoka, Japan

[21] Appl. No.: 941,434

[22] Filed: Dec. 15, 1986

[51] Int. Cl.[4] ............................................. H01J 37/285
[52] U.S. Cl. .................... 250/306; 250/310; 250/397
[58] Field of Search ............... 250/306, 307, 397, 311, 250/396, 310; 313/477 A, 495, 2.1, 411, 413, 470

[56] References Cited

U.S. PATENT DOCUMENTS 2,267,137 12/1941 Ruska et al. ................... 250/397
4,096,386 6/1978 Rempfer et al. ................ 250/306

Primary Examiner—Bruce C. Anderson
Assistant Examiner—Jack I. Berman
Attorney, Agent, or Firm—Finnegan, Henderson Farabow, Garrett and Dunner

[57] ABSTRACT

A high time resolution electron microscope unit comprising a beam source for generating an exciting beam; a microscope for exposing the surface of a specimen to be observed to the exciting beam for emitting electrons from the surface; an image formation device for receiving the emitted electrons and for displaying an image representative of variations in the surface of the specimen; a gate mechanism for controlling the flow of emitted electrons from the specimen toward the image formation device; deflecting plates for deflecting the emitted electrons from the gate mechanism onto the image formation device; and a drive circuit for synchronizing the operation of the gate mechanism, the deflecting coil and the beam source.

11 Claims, 3 Drawing Sheets

HIGH TIME RESOLUTION ELECTRON MICROSCOPE

BACKGROUND OF THE INVENTION

This invention relates to a high time resolution electron microscope unit which applies a high-energy light beam or particle beam to the surface of a substance in a vacuum container to detect at ultra high speed the two-dimensional conditions or structural variations of the surface of the substance.

Heretofore, electron emission type electron microscopes or Muller type electron microscopes have been employed to examine the conditions of the surface of substances held in a vacuum container.

The electron emission type electron microscope operates on the following principles. When light is applied to the surface of a substance held in a vacuum container, or when the substance itself is heated, the substance emits electrons, and an electron image corresponding to the structure of the surface of the substance is formed near the substance. This electron image may be formed in enlarged scale on an output phosphor screen by means of an electron lens.

In the Muller type electron microscope, a high voltage is applied between a small needle in the vacuum and a phosphor screen confronting the small needle, thereby to form a high intensity electric field at the end of the needle. In this operation, the emission of electrons in the electric field is perpendicular to the extremely small semi-spherical surface of the needle end, and therefore the electron beam spreads radially to strike the output phosphor screen, thus forming an optical image.

The optical image thus formed corresponds to the structure of the surface of the needle. Therefore, the molecular image of a gas adsorbed onto the surface of the needle can be obtained by this method.

In the case where the variation with time of the surface of a substance under observation is slow, the above-described electron microscope can be used to visually observe this variation. However, when the surface of the substance varies at high speed, the human eye cannot follow the variation. Furthermore, even if, in this case, it is intended to take the picture of the optical image on the phosphor screen with a high-speed camera, the phosphor screen itself cannot respond to the rapid variation. For instance, in the case where the variation is of several microseconds ($\mu s$), the images overlap.

It is known in the art that when a high-luminance extremely short laser pulse, electron beam pulse or ion beam pulse is applied to a substance, the energy causes a high-speed reaction to the substance in an extremely short time. As a result, the structure of the surface of the substance is changed at extremely high speed.

This reaction occurs at an extremely high rate. Therefore, in most cases only the structure of the surface which has not yet been subjected to the reaction or the structure of the surface which already has been subjected to the reaction can be detected. However, it is essential for the study of the physical properties of the substance to be able to detect the transition between these two structures.

SUMMARY OF THE INVENTION

Accordingly, a primary object of this invention is to provide a high time resolution electron microscope unit in which a high-speed reaction is caused with the surface of a specimen in the vacuum container, and in which the extremely-high-speed variation caused in the structure and the physical property such as electric potential and so on, of the surface of the specimen by the reaction can be detected.

Additional objects and advantages will be obvious from the description which follows, or may be learned by practice of the invention.

In order to achieve the foregoing object of the invention, the high time resolution electron imcroscope unit of the present invention comprises beam source means for generating an exciting beam; microscope means for exposing the surface of a specimen to be observed to the exciting beam for emitting electrons from the surface; image formation means for receiving the emitted electrons and for displaying an image representative of variations in the surface of the specimen; gate means for controlling the flow of emitted electrons from the specimen toward the image formation means; deflecting means for deflecting the emitted electrons from the gate means onto the image formation means; and drive means for synchronizing the operation of the gate means, the deflecting means and the beam source means.

It is preferred that the beam source means include a laser generator, and the microscope means include a vacuum tube having a sealable opening therein. In addition, the image formation means may include at least one phosphor screen.

It is preferred that the gate means include a first deflecting electrode and a beam blocking electrode. Also, the deflecting means preferably includes a second deflecting electrode.

The microscope means preferably include accelerating means for accelerating electrons emitted from the specimen toward the phosphor screen, and the microscope unit also preferably includes lens means for focusing the electrons emitted by the surface into an enlarged image.

A second alternative high time resolution electron microscope unit according to the invention comprises: an electron microscope body including a vacuum container, means for supporting a specimen in the container, a plurality of phosphor screen provided respectively on the inner surfaces of a plurality of cylinders arranged in a line which are confronted with the specimen, accelerating means for accelerating electrons emitted from the specimen towards the phosphor screen, electron lenses for image-forming in enlarged form electrons emitted from the specimen, and deflecting means for deflecting in the direction of the line an electron beam emitted from the specimen to apply the electron beam to the plurality of phosphor screen successively; and exciting beam source for exciting the specimen in the container; and a sloped voltage generating circuit for applying a sloped voltage to the deflecting beams in synchronization with the exciting operation of the exciting beam source.

A third alternative high time resolution electron microscope unit according to the invention comprises: an electron microscope body including a vacuum container, a bar-shaped cathode for supporting a specimen on the top in the vacuum container, a phosphor screen provided on the inner surface of the vacuum container, accelerating means for accelerating electrons emitted from the specimen towards the phosphor screen, an electron lens for image-forming in enlarged form on the phosphor screen electrons emitted from the specimen, gate means for intermittently transmitting electrons emitted from the specimen towards the phosphor screen, and deflecting means for deflecting an electron beam passed through the gate means to apply the electron beams to different positions on the phosphor screen; and exciting beam source for exciting the specimen in the container; and drive circuits for driving the gate means and the deflecting means in synchronization with the exciting operation of the exciting beam source.

BRIEF DESCRIPTION OF THE DRAWINGS

The accompanying drawings, which are incorporated in and constitute a part of the specification, illustrate several embodiments of the invention, and, together with the description, serve to explain the principles of the invention.

Of the drawings.

DESCRIPTION OF THE PREFERRED EMBODIMENTS

This invention will be described with reference to the accompanying drawings in more detail.

Figure 1:
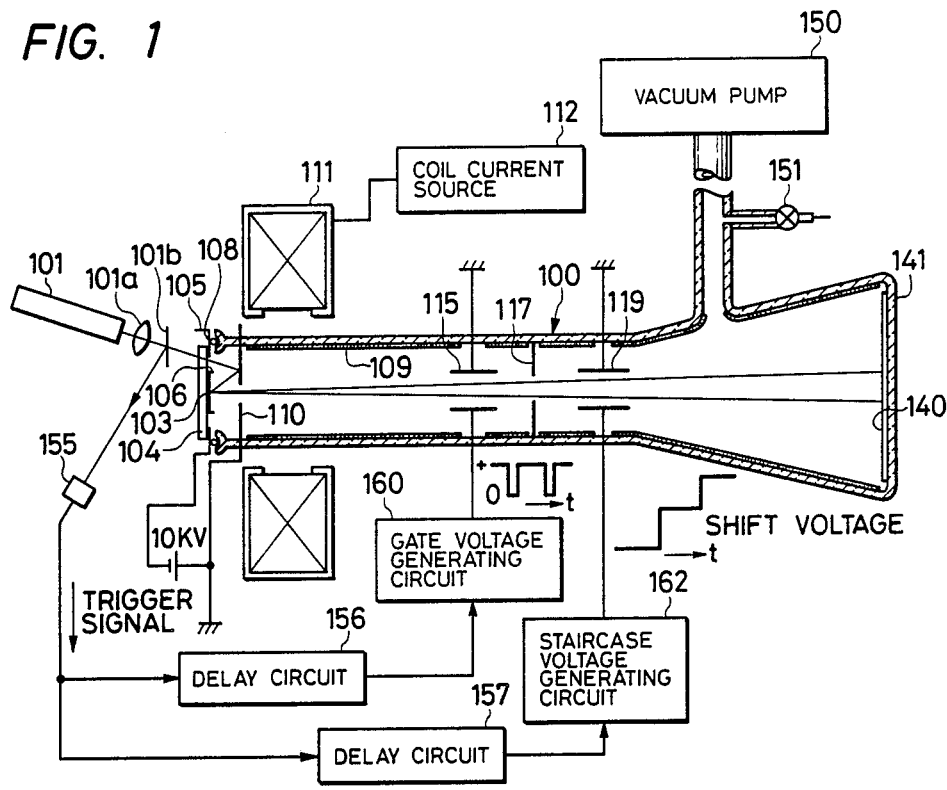
FIG. 1 is a block diagram, partly as a sectional diagram, showing a first example of a high time resolution electron microscope unit, with its electron tube sectioned.

FIG. 1 is a block diagram, partly as a sectional diagram (an electron tube sectioned) showing a first example of a high time resolution electron microscope unit according to the invention.

The body of the electron microscope unit (hereinafter referred to as "an electron microscope body" when applicable) includes a vacuum container 100.

A means for supporting a specimen 103 in the vacuum container 100 has a transparent window 104 and a specimen holder 106 provided on the inner surface of the window 104.

In the case where the specimen is a semiconductor chip, variations of the semiconductor chip, which are caused by the application of the aforementioned laser beam, can be observed under the electron microscope.

A phosphor screen 140 is formed on the inner surface of the output surface of the container 100 which confronts with the specimen 103. Electrons generated by the specimen 103 are accelerated by an accelerating means, namely, an electrode 110 with a hole, towards the phosphor screen 140. A coil current source 112 supplies an excicing current to a focusing coil 111 so that electrons emitted from the specimen 103 are focused in enlarged form; that is, the focusing coil 111 forms an electron lens.

A gate means is provided to permit the electrons generated by the specimen 103 to intermittently transmit towards the phosphor screen 140. As embodied herein, the gate means includes a first deflecting electrode 115 and a beam blocking electrode 117. An electron beam passed through the gate means mentioned above, being deflected by a deflecting means including a second deflecting electrode 119, is applied to a different position on the phosphor screen 140.

A laser generating device 101 acts as a source for exciting the specimen 103. Drive circuits for driving the gate means and the deflecting means, i.e., a gate voltage generating circuit 160 and a staircase voltage (shift voltage) generating circuit 162 are operated in association with the operation of the exciting source, mentioned above.

The laser generating device 101 for exciting a specimen 103 applies the laser beam to a specimen 103 under observation. This causes a high-speed reaction on the surface of the specimen 103, and simultaneously causes the surface of the specimen to emit photoelectrons.

The vacuum container 100 is substantially cylindrical, and the transparent window 104 has a metal flange 105. The container 100 is evacuated by a vacuum pump 150 with the flange 105 pushed against one end of the container 100 through an O-ring 108, so that the inside of the container 100 is maintained air-tight. The cylindrical container 100 is provided with a leak valve 151 so that, after measurement, the pressure in the container 100 is restored back to the atmospheric pressure, and the container 100 is evacuated again until a new specimen fixed on the transparent window.

As was described before, the specimen holder 106 adapted to detachably mount a specimen thereon is provided on the inner surface of the input window 104.

The anode 110 has an aperture at the center which confronts with the specimen 103. A voltage, for instance 10 KV, is applied across the specimen 103 and the anode 110. For this purpose, the input window 104 is welded to the metal flange 105. Therefore, the metal flange 105 is electrically connected to the specimen 103 on the inner surface of the input window 104, and the DC voltage 10 KV is applied across the metal flange 105 and the anode electrode 110.

A focusing coil 111 for forming the photoelectron image formed on the surface of the specimen 103 on the phosphor screen is provided around the end portion of the container 100 closer to the specimen 103. The longitudinal axis of the container 100 coincides with the axis of the coil 111.

On the other end of the container 100, a light transmissive window 141 is provided. A phosphor screen 140, on which the enlarged electron image of the surface of a specimen 103 is formed, is provided on the inner surface of the window 141.

A first deflecting electrode 115 for gating the photoelectron beam emitted from the surface of the specimen under observation, a beam blocking electrode 117 having an aperture at the center, and a second deflecting electrode 119 are provided for arranging a plurality of photoelectron images on the phosphor screen between the anode 110 and the phosphor screen 140 in such a manner that the images are arranged along the direction perpendicular to the axis of the vacuum container 100.

The part of the wall of the vacuum container 100 located between the metal flange 105 with the light transmissive window holding a specimen and the anode 110, is made of insulating material such as glass or ceramic, because a high voltage is applied to that part of the wall.

The part of the wall of the vacuum container 100 located between the anode 110 and the phosphor screen 140, except for the parts surrounding the lead wires of the first and second defecting electrodes 115 and 117, is held at ground potential. Therefore, that part of the wall is made of the same insulating material such as glass, and a metal film 109 of aluminum or the like is formed on the wall by vacuum deposition except for the parts surrounding the lead wires of the deflecting electrodes.

The above-described method of forming the vacuum container may be replaced by the following method. The cylindrical wall of the vacuum container may be made of metal, and the parts surrounding the lead wires of the deflecting electrodes may be made of insulating material such as glass. The surface of the anode 110 which confronts with a specimen 103 serves as an optical mirror for reflecting the laser beam.

The circuitry of the high-speed resolution electron microscope unit thus constructed now will be described in association with its operation.

The laser generating device 101 generates a laser beam having a pulse width of 100 ns. The laser beam thus generated is applied through a lens 101a, a half-mirror 101b and the light transmissive window 104 onto the surface of the anode 110, and is reflected thereby, so that the laser beam partially irradiates the specimen 103. In order to cause a reaction to a small region of the specimen 103 when irradiated by the laser beam, the laser beam is kept small in diameter.

When the specimen 103 is irradiated by the laser beam as described above, the structure of its surface is changed, and a photoelectron beam is emitted from the surface. On the surface of the specimen 103, the photoelectrons have a density distribution according to the structure of the specimen surface. The photoelectron beam is accelerated towards the phosphor screen 140 by the voltage 10 KV which is applied across the specimen 103 and the anode 110.

The individual photoelectrons forming the photoelectron image on the surface of the specimen have various initial velocities. However, they are focused by the electron lens comprising the focusing coil 111, thus forming the enlarged image on the phosphor screen 140. During this operation, the photoelectron beam is gated and deflected. The photoelectron beam is continuously emitted from the specimen 103. However, the aforementioned gating operation permits transmission of the photoelectron beam towards the phosphor screen 140 only when the observation is required, and it inhibits the transmission of the photoelectron beam when the observation is not required.

Figure 2:
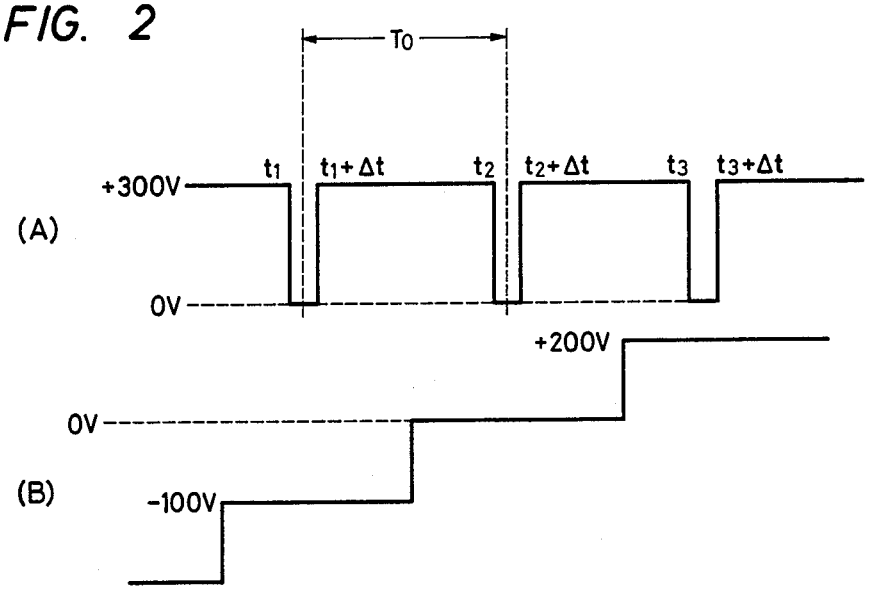
FIG. 2 is a waveform diagram showing the waveforms of pulse voltages applied to first and second deflecting electrodes in the electron microscope unit shown in FIG. 1.

This operation is achieved by the first deflecting electrode 115 and the beam blocking electrode 117. The photoelectron beams passed through the beam blocking electrode 117 are arranged on the phosphor screen 140 by the second deflecting electrode 119 according to their passage time. FIG. 2 shows the waveforms of pulse voltages applied to the first and second deflecting electrodes.

More specifically, part (A) of FIG. 2 shows the waveforms of the pulse voltage applied to the first deflecting electrode 115. One side of the deflecting plate of the first deflecting electrode 115 is held at ground potential (0 V). Therefore, the photoelectron beam passes through the beam blocking electrode 117 for the periods $t_1$-$t_1+\Delta t$, $t_2$-$t_2+\Delta t$ and $t_3$-$t_3+\Delta t$ for which zero (0) volts is applied thereto. For the other periods 300 V is applied across the deflecting plates, so that the beam is deflected and cut off by the beam blocking electrode 117.

Part (B) of FIG. 2 shows the staircase voltage applied to the second deflecting electrode 119. The voltage shown in the part (B) of FIG. 2 arranges the photoelectron beams successively on the phosphor screen 140. These beams previously have passed through the beam blocking electrode 117 for the aforementioned periods of time $t_1$-$t_1+\Delta t$, $t_2$-$t_2+\Delta t$, and $t_3$-$t_3+\Delta t$. As a result, three pictures can be obtained in frame form. The above-described voltages are produced by the gate voltage generating circuit 160 and the staircase voltage generating circuit 162. A synchronizing circuit is provided to select the time instants $t_1$, $t_2$ and $t_3$ as required, thereby to obtain images, when necessary.

The part of the laser beam causing the reaction with the specimen 103 is reflected by the half-mirror 101b and subjected to photoelectric conversion by a PIN photodiode 155, thus forming a trigger signal. The trigger signal thus formed is applied to delay circuits 156 and 157, the outputs of which are applied to the gate voltage generating circuit 160 and the staircase voltage generating circuit 162, respectively, to operate these circuits, as shown in FIG. 2. This method can provide an exposure time of several nanoseconds ($\Delta t$ in FIG. 2) and a picture taking period of several tens of nanoseconds ($T_0$ in FIG. 2).

Figure 3:
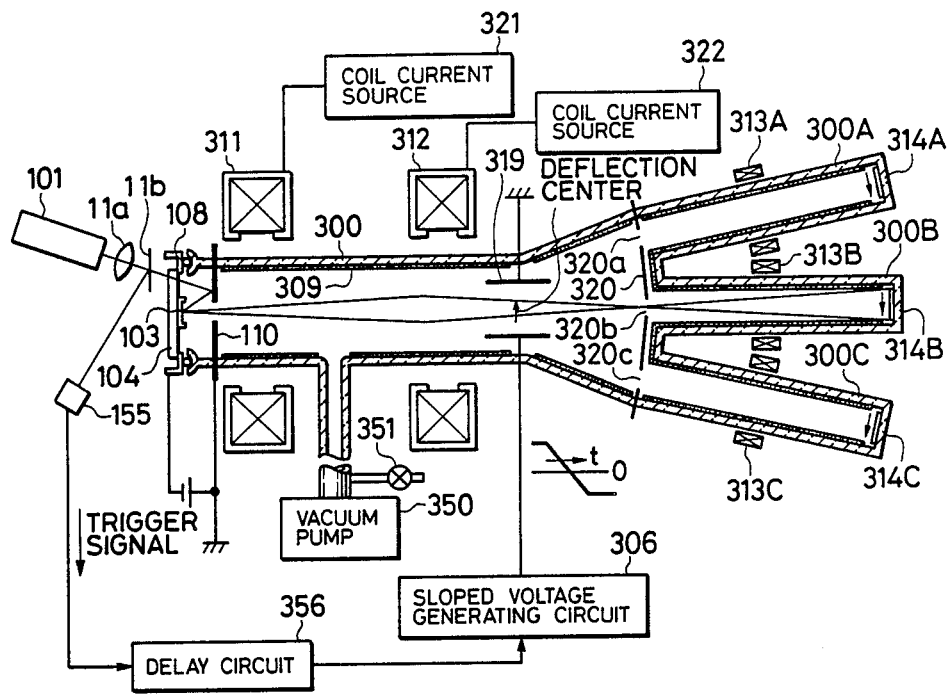
FIG. 3 is a block diagram, partly as a sectional diagram, showing a second example of the high-speed resolution electron microscope unit, with its electron tube sectioned.

FIG. 3 is a block diagram, partly as a sectional diagram (an electron microscope body section), showing a second example of a high time resolution electron microscope unit according to this invention.

In the first example of the electron microscope unit described above, the maximum picture taking period is several tens of nanoseconds. If a picture taking period shorter than that value is employed, then the gate voltage and the stair-step-shaped voltage become irregular in waveform, and the resultant pictures become blurred.

The second example of the electron microscope unit permits an exposure time and picture taking period of from several tens of nanoseconds(ns) to the order of picoseconds(ps).

As with the first embodiment, the electron microscope body has a vacuum container 300. The mean for supporting a specimen 103 in the vacuum container 300 is the same as that in first example described above.

In the electron microscope unit of FIG. 3, the vacuum container 300 includes three cylinders 300A, 300B and 300C which have phosphor screens 314A, 314B and 314C at their bottoms, respectively. More specifically, the cylinders 300A, 300B and 300C have openings through which the phosphor screens 314A, 314B and 314C confront with the specimen 103. Electrons emitted from the specimen 103 are accelerated towards the phosphor screens by accelerating means, namely, an anode 110 with an aperture. Electrons emitted from the specimen 103 are focused in enlarged image form on the phosphor screen 314A by means of a first focusing coil 311, a collimating coil 312 and an electron lens comprising a second focusing coil 313A.

Similarly, electrons emitted from the specimen 103 are focused in enlarged image form on the phosphor screen 314B by means of the first focusing coil 311, the collimating coil 312 and an electron lens comprising another second focusing coil 313B. A deflecting electrode 319 forms a deflecting means which operates to deflect the electrons generated by the specimen successively toward the phosphor screens.

The first focusing coil 311 operates as follows. The enlarged electron image of a small part of the specimen 103 under observation is formed on the section which is perpendicular to the axis of the container 300. This section includes the deflection center of the deflecting electrode 319 (which is the virtual point from which the locus of the electron beam deflected by the deflecting electrode looks extended).

In this operation, the direction of the electron beam is controlled by the collimating coil 312 before the deflecting electrode 319, so that the electron beam passes through the center of the aperture of the next beam blocking electrode 320.

Figure 4:
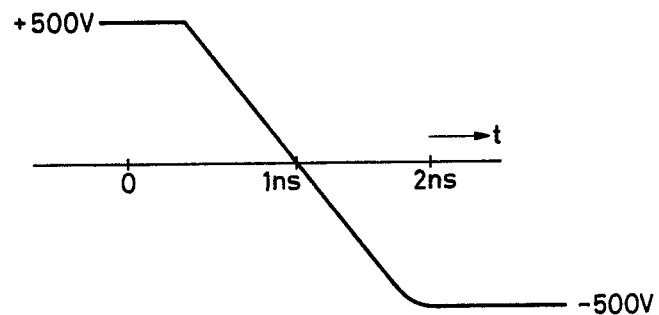
FIG. 4 is a graphical representation indicating the waveform of the voltage outputted by a sloped voltage generating circuit in the electron microscope unit shown in FIG. 3.

The electron beam sweeps the apertures formed in the beam blocking electrodes 320 which are arranged radially with respect to the deflecting electrode 319. This sweeping operation is achieved by applying a sloped voltage (as shown in FIG. 4) to the deflecting electrode 319. In this connection, the exposure time is determined by the time it takes for the electron beam to pass through the apertures 320a, 320b and 320c of the beam blocking electrodes 320.

The electron beams passed through the apertures are further directed through the electron lenses comprising the second focusing coils 313A,, 313B and 313C, and are applied to the output phosphor screens 314A, 314B and 314C, thus forming optical images thereon.

While the electron beam sweeps the apertures 320a, 320b and 320c, the electron image formed on the plane perpendicular to the axis of the container which includes the deflection center of the deflecting electrode 319 is formed as still images on the phosphor screens 314A, 314B and 314C by the second focusing coils 313A, 313B and 313C, respectively. In this case, the image is formed at the deflection center. Therefore, if an optional point of the image formed at the deflection center is taken into consideration with respect to the focusing electron lenses comprising the second focusing coils 313A, 313B and 313C, the electron beam deflected through various angles from that point to enter the focusing electron lenses can be handled in the same manner as the electron beams emitted radially from the point.

This is because the image of the point of the electron image is focused at one point on the output side of the lens, and the other points of the electron image are handled in the same manner.

When the electron beam is swept along the beam blocking electrodes 320, the time between two adjacent aperture centers is the picture taking interval. Thus, a plurality of pictures (three pictures in the above-described example of FIG. 3) can be obtained in frame form.

In the case where the sloped sweep voltage is utilized, as described above, it is unnecessary to take into account the difficulty that the voltage waveforms become irregular. Therefore a frame-formed picture taking operation can be performed with an extremely high exposure time such as from several tens of nanoseconds (ns) to a hundred pico-seconds (ps).

Figure 5:
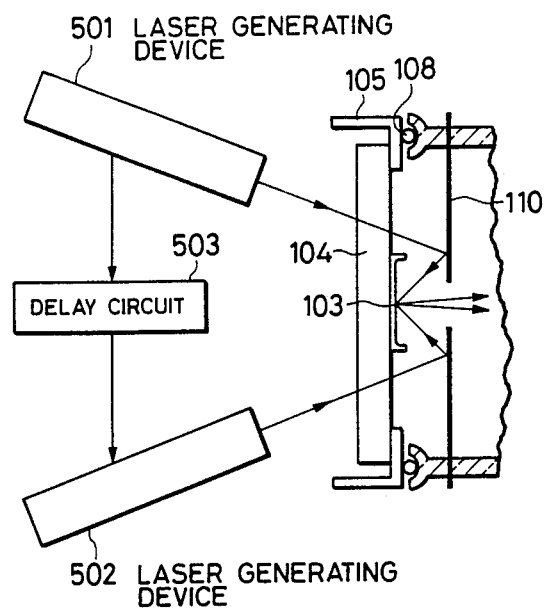
FIG. 5 is a block diagram, partly as a sectional diagram, showing the exciting section of a third example of the high time resolution electron microscope unit according to the invention, with its electron tube sectioned.

FIG. 5 is a block diagram showing a third example of a high time resolution electron microscope unit according to the invention in which the reaction to a specimen and the generation of photoelectrons are caused by different exciting sources. More specifically, FIG. 5 is a sectional view of a part of an electron tube which surrounds a specimen. The remaining parts of the electron tube may be similar to those of the first or second example, described above.

A high-power laser pulse generating device 501 applies a laser pulse to a specimen 103 to cause a reaction thereon. Next, in order to observe the structure variation of the specimen, a photoelectron emitting laser source 502 whose output is too low to cause a reaction on the specimen generates a laser pulse.

The photoelectron emitting laser source 502 is activated a predetermined period of time after the irradiation of the specimen has been performed by the high-power laser pulse generating device 501. The delay time is determined by a delay circuit 503.

The above-described irradiation can be achieved with one and the same laser source. However, the above-described method is larger in degree of freedom.

Figure 6:
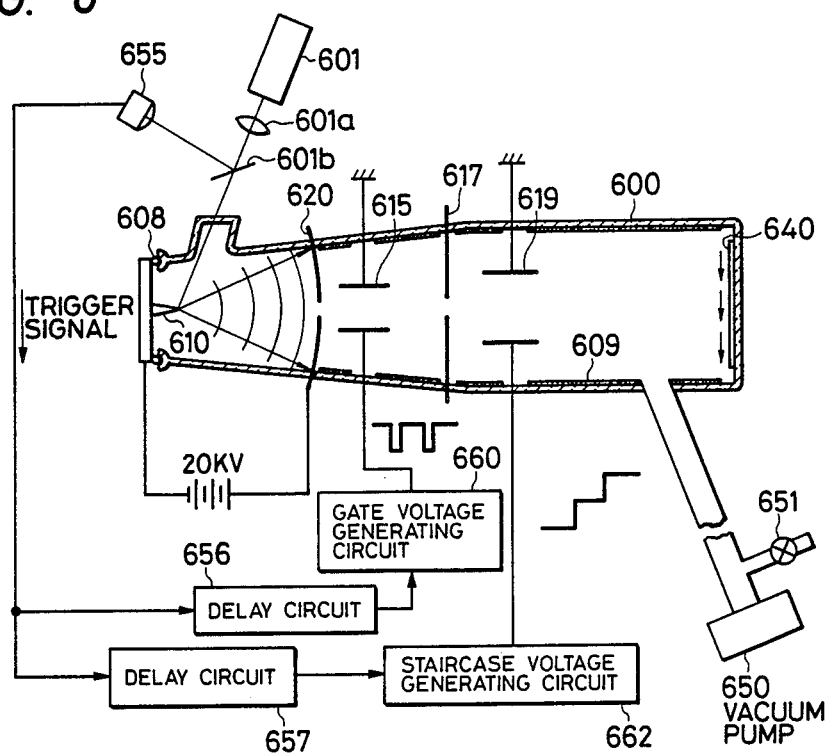
FIG. 6 is a block diagram, partly as a sectional diagram, indicating a fourth example of the high time resolution electron microscope unit according to the invention, with its electron tube sectioned.

FIG. 6 is a block diagram, partly as a sectional diagram (an electron microscope body sectioned), showing a fourth example of the high time resolution electron microscope unit according to the invention.

The fourth example of FIG. 6 is obtained by applying the technical concept of the invention to the Muller type electron microscope, which has been described in the introductory part of the specification.

As in the previous embodiments, the electron microscope body has a vacuum container 600. The specimen is a cesium atom layer provided on the bar-shaped protrusion of a cathode 610 of tungsten. The cathode 610 is connected in an air tight manner to the container 600 through an O-ring.

A phosphor screen 640 is provided on the surface of the vacuum container which confronts with the specimen. A beam control electrode 620 serves also as a means for accelerating the electrons which have been emitted from the specimen towards the phosphor screen 640.

A first beam deflecting electrode 615 and a beam blocking electrode 617 form a gate means for intermittently permitting the transmission of electrons emitted from the specimen towards the phosphor screen. These electrodes 615 and 617 operate in the same manner as those in FIG. 1.

A second deflecting electrode 619 forms a deflecting means for deflecting the electrons which have passed through the aforementioned gate means to apply them to different points on the phosphor screen 640.

The specimen in the container 600 is excited by an exciting laser beam source, namely, a laser generating device 601. The laser beam produced by the laser generating device 601 is applied through the wall of the container 600 to the top of the cathode 610. The gate means and the deflecting means are driven in synchronization with the aforementioned laser beam source. The laser beam from the laser generating device 601 is detected by a PIN photodiode 655, thus forming a trigger pulse. The trigger pulse thus formed is applied through a delay circuit 656 to a gate voltage generating circuit 660 and through a delay circuit 657 to a staircase voltage generating circuit 662.

The considerably small spherical surface of the cathode 610 is irradiated by the laser beam outputted by the laser generating device 601. As a result, electrons are emitted radially from the spherical surface of the cathode 610 and accelerated by the beam control electrode 620, thus being moved towards the phosphor screen 640.

The first deflecting electrode 615, the beam blocking electrode 617 and the second deflecting electrode 619 are similar both in configuration and in function to those shown in FIG. 2. Furthermore, a vacuum pump 650 and a leak valve 651 are also similar to those shown in FIG. 1.

A part of the laser pulse outputted by the laser generating device 601b, being reflected by a half-mirror 601, is applied to the PIN photodiode 655, thus providing the trigger pulse. The trigger pulse thus provided is applied through the delay circuit 656 to the gate voltage generating circuit 660. Thus, the circuit 660 produces a pulse signal corresponding to the exposure time. Trigger pulse is further applied through the delay circuit 657 to the staircase voltage generating circuit 662, so that the circuit 662 provides a staircase voltage. The voltage thus provided determines the position of the enlarged electron image on the phosphor screen 640.

While preferred embodiments of this invention have been described, it will be obvious to those skilled in the art that various changes and modifications may be made therein without departing from the invention, and it is aimed, therefore, to cover in the appended claims all such changes and modifications as fall within the true spirit and scope of the invention.

In the above-described embodiments, the laser pulse is employed to cause the reaction to the specimen. However, it should be noted that γ-ray pulses, neutron pulses, ion beam pulses and the like can be employed.

As is apparent from the above detailed description, according to the invention, an ultra high speed reaction can be caused on the surface of a specimen in the vacuum container, and the variations in structure of the surface of the specimen during the reaction, which heretofore could not be observed, now can be detected as separate images.

Furthermore, according to the invention, the electrons emitted from the surface of a substance under observation are focused in enlarged form on the output phosphor screen to obtain the optical image. In addition, electrodes for deflecting and blocking the electron beam are provided in the path of the electron beam according to the invention. The deflecting voltage and the gate voltage are applied to these electrodes, as required, so that a plurality of pictures in frame form showing the variations in structure of the surface of the substance can be obtained on the output phosphor screen.

What is claimed is:

1. A high time resolution electron microscope unit comprising:
   beam source means for generating an exciting beam;
   microscope means for exposing the surface of a specimen to be observed to the exciting beam for emitting electrons from the surface;
   image formation means for receiving the emitted electrons and for displaying an image representative of variations in the surface of the specimen;
   gate means for controlling the flow of emitted electrons from the specimen toward the image formation means;
   deflecting means including a deflecting plate for deflecting the emitted electrons from the gate means successively onto the image formation means to detect high speed variations; and
   drive means for synchronizing the operation of the gate means, the deflecting means and the beam source means to obtain a plurality of images on the image formation means in frame form.

2. The microscope unit of claim 1 wherein the beam source means includes a laser generator, and the microscope beams includes a vacuum tube having a sealable opening therein.

3. The microscope unit of claim 2 wherein the image formation means includes at least one phosphor screen.

4. The microscope unit of claim 3 wherein the gate means includes a first deflecting electrode and a beam blocking electrode.

5. The microscope unit of claim 4 wherein the microscope means includes accelerating means for accelerating electrons emitted from the specimen toward the phosphor screen.

6. The microscope unit of claim 5 also including lens means for focusing the electrons emitted by the surface into an enlarged image.

7. The microscope unit of claim 5 wherein the accelerating means includes an anode having an aperture disposed adjacent to the specimen for reflecting the exciting beam and irradiating the specimen.

8. The microscope unit of claim 1 wherein the microscope means includes a vacuum container, and means for supporting the specimen in the container.

9. The microscope unit of claim 8 wherein to support means includes a bar-shaped cathode.

10. A high time resolution electron microscope unit comprising:
    beam source means for generating an exciting beam;
    microscope means for exposing the surface of a specimen to be observed to the exciting beam for emitting electrons from the surface, wherein the microscope means includes a vacuum container, and means for supporting the specimen in the container;
    image formation means for receiving the emitted electrons and for displaying an image representative of variations in the surface of the specimen;
    gate means for controlling the flow of emitted electrons from the specimen toward the image formation means;
    deflecting means for deflecting the emitted electrons from the gate means onto the image formation means; and
    drive means for synchronizing the operation of the gate means, the deflecting means and the beam source means;
    wherein the container includes a plurality of cylinders each having an inner surface, and the image formation means includes a plurality of phosphor screens on the inner surfaces.

11. The microscope unit of claim 10 wherein the drive means includes a sloped voltage generating circuit for applying a sloped voltage to the deflecting means in synchronization with the exciting beam from the beam source.

* * * * *